United States Patent [19]

Nenyei et al.

[11] Patent Number: 5,359,693
[45] Date of Patent: Oct. 25, 1994

[54] METHOD AND APPARATUS FOR A RAPID THERMAL PROCESSING OF DELICATE COMPONENTS

[75] Inventors: Zsolt Nenyei, Blaustein-Herrlingen; Thomas Knarr, Ulm; Heinrich Walk, Allmendingen, all of Fed. Rep. of Germany

[73] Assignee: AST elektronik GmbH, Kirchheim, Fed. Rep. of Germany

[21] Appl. No.: 913,093

[22] Filed: Jul. 14, 1992

[30] Foreign Application Priority Data

Jul. 15, 1991 [DE] Fed. Rep. of Germany ....... 4123318

[51] Int. Cl.$^5$ ........................................... H01L 21/00
[52] U.S. Cl. .................... 392/418; 392/416; 118/724; 437/247; 364/557; 219/497
[58] Field of Search .............. 219/405, 411, 390, 497; 392/416, 418; 118/724, 725, 50.1; 364/477, 557; 437/247, 248

[56] References Cited

U.S. PATENT DOCUMENTS

| | | | |
|---|---|---|---|
| 3,015,591 | 1/1962 | Zaratkiewicz et al. | 437/138 |
| 3,723,053 | 3/1973 | Myers et al. | 432/11 |
| 3,836,751 | 9/1974 | Anderson | 219/411 |
| 3,862,397 | 1/1975 | Anderson et al. | 219/405 |
| 4,101,759 | 7/1978 | Anthony et al. | 219/405 |
| 4,221,956 | 9/1980 | Fielding | 219/411 |
| 4,356,384 | 10/1982 | Gat . | |
| 4,432,809 | 2/1984 | Chye et al. | 432/18 |
| 4,436,985 | 3/1984 | Weber | 219/388 |
| 4,524,264 | 6/1985 | Takeuchi | 219/497 |
| 4,550,245 | 10/1985 | Arai et al. | 219/405 |
| 4,581,520 | 4/1986 | Vu et al. | 219/405 |
| 4,640,224 | 2/1987 | Bunch et al. | 118/725 |
| 4,678,432 | 7/1987 | Teraoka | 432/12 |
| 4,680,447 | 7/1987 | Mahawili | 219/405 |
| 4,698,486 | 10/1987 | Sheets | 219/405 |
| 4,836,138 | 6/1989 | Robinson et al. | 118/725 |
| 4,979,134 | 12/1990 | Arima et al. | 364/557 |
| 4,982,693 | 1/1991 | Ebata | 118/725 |
| 5,063,518 | 11/1991 | Curreri et al. | 364/557 |
| 5,147,498 | 9/1992 | Nashimoto | 118/725 |
| 5,151,871 | 9/1992 | Matsumura et al. | 364/557 |

FOREIGN PATENT DOCUMENTS

| | | |
|---|---|---|
| 0290692 | 5/1987 | European Pat. Off. . |
| 60-131430 | 7/1985 | Japan . |
| 60-253939 | 12/1985 | Japan . |
| 62-52926 | 3/1987 | Japan . |
| 63-282268 | 11/1988 | Japan . |
| 64-49127 | 2/1989 | Japan . |
| 2-310917 | 12/1990 | Japan . |
| 3-28376 | 2/1991 | Japan . |

OTHER PUBLICATIONS

Hill et al "Rapid Thermal Annealing–Theory and Practice" NATO Summer School: Reduced Thermal Processing for ULSI, Boca Raton Florida, Jun. 20 to Jul 1, 1988.

Vandenabele et al "Impact of Patterned layers on Temperature Non–Uniformity During Rapid Thermal Processing for VLSI-Applications" 1989 Spring Meeting of the Materials Research Society, Apr. 25-28, 1989.

Kakoschke "Temperature Problem with Rapid Thermal Processing for VLSI Applications", Nuclear Instruments Methods in Physics Research, B37/38(1989) pp. 753-759.

Primary Examiner—Bruce A. Reynolds
Assistant Examiner—John A. Jeffery
Attorney, Agent, or Firm—Lowe, Price, LeBlanc & Becker

[57] ABSTRACT

A low defect rate is provided in rapid thermal processing of delicate components with reduction of defects caused by inhomogeneities of temperature during a rapid thermal processing. In a suitable system a defect-guarded RTP method is carried out in such a manner that the density of the heating energy is adjusted in consecutive intervals of time, which may be as short as desired, to such automatically controlled limiting values or to such fixed values that in the reaction chamber the difference between the primary and secondary energy densities is almost continuously held at the minimum which is achievable throughout the thermal processing whereas the ramps have predetermined slopes.

30 Claims, 8 Drawing Sheets

DISPLAY OF STORED TEMPERATURE PROFILES

Convent. rapid thermal process.

DISPLAY OF STORED TEMPERATURE PROFILES

Comparison of the actual heating rates using conventional or defect guarded heating Substrate: 150mm diam. Si wafer

DISPLAY OF STORED TEMPERATURE PROFILES

Defect guarded rapid thermal process, displayed in high time resolution

METHOD AND APPARATUS FOR A RAPID THERMAL PROCESSING OF DELICATE COMPONENTS

BACKGROUND OF THE INVENTION

1. Field of the Invention

This invention relates to a method for a fast thermal treatment of delicate components, particularly of components made by or used in the semiconductor industry, comprising heating in a reaction chamber by at least one heat source that is automatically controlled by a heating power controller and used to change the temperature of the components, and also relates to an apparatus for a rapid thermal processing of delicate components, particularly for a processing of components made by or used in the semiconductor industry, comprising at least one heat source, which is disposed in a reaction chamber and is automatically controlled by a heating power controller and used to change the temperature of the components.

2. Description of the Prior Art

Rapid heating is a highly versatile optical heating process, which can mainly be used in semiconductor technology. But applications in the production of other components used in microelectronics are being increasingly investigated, for instance in the superconductor technology, the production of novel types of solar cells or of ceramic products.

Rapid heating systems, sometimes described as "rapid thermal processing" (RTP) systems may be used in various material-treating processes for effecting sudden changes of the temperature and of the purging gas atmosphere. The total applied heat in thermal processing can be reduced by that method.

Numerous RTP systems can be used for a thermal treatment of non-structured, homogeneous materials in the form of disks or wafers, such as semiconductor wafers. Such wafers comprise various materials or coatings having a geometric or chemical structure, such as in-process wafers in the production of semiconductors, and often respond to a rapid and short temperature change by a formation of excessively large structural defects.

Such defects have been described in "Rapid Thermal Annealing Theory and Practice" by C. Hill, S. Jones, and D. Boys, NATO Summer School: Reduced Thermal Processing for ULSI, Boca Raton Fla., Jun. 20 to Jul. 1, 1988; in "Impact of Patterned Layers on Temperature Non-Uniformity During Rapid Thermal Processing for VLSI Applications" by P. Vandenabeele, K. Maex, R. DE Keersmaekker, 1989 Spring Meeting of the Material Research Society, San Diego, Symposium B: RTA/CVD and integrated processing, Apr. 25-28, 1989, and in "Temperature Problems with Rapid Thermal Processing for VISI Applications" Dr R. Kakoschka, Nuclear Instruments and Methods in Physics Research, B 37/38 (1989), pages 753-759.

All effects mentioned hereinbefore may be superposed in an RTP process.

Non-structured wafers or wafers having only minute structures will withstand conventional temperature fluctuations relatively well unless they are particularly delicate. But modern components are delicate and are not uniformly structured, as a rule, in the substrate wafer. The novel applications of RTP systems are restricted by the fact that too many defects are produced by rapid heating processes carried out in conventional RTP systems.

The following hardware effects are presently regarded as physical causes of inhomogeneities of temperature occurring in the RTP process:

1. Hardware effects a) Modes of irradiation which may be used in the RTP chamber include, e.g.:
-irradiation from one side,
-irradiation from two or more sides,
-irradiation with a homogeneous energy flux,
-irradiation at a normal angle of incidence,
-isotropic or quasi-isotropic irradiation,
-irradiation with a wide energy spectrum (e.g., by tungsten-halogen lamps at wavelengths of 0.4 to 4 micrometers), and
irradiation with black-body radiation, optionally in combination with line spectra.

b) Designs which may be selected for the reflectors around the reaction chamber:
all surrounding wall surfaces are highly reflective (that design is described as a "photon box"),
the walls have different reflecting powers.

RTP chambers having different designs will give rise to different inhomogeneities of temperature in the transient and steady-state modes of the RTP method.

For an exact interpretation of said relationships a distinction must be made between the heat sources (primary energy flux) and the energy which is emitted and reflected by the components, particularly by the wafers (secondary energy flux).

During the heating-up mode the primary energy flux predominates so that rays generated by multiple reflection will be incident in a larger number on the marginal areas of the wafer, which is self-vignetting toward its center. As a result, the marginal areas of the wafer are hotter than the central region during the heating up (photon box effect).

The following effects will now be discussed regarding the substrate:

2. Marginal effect

The secondary energy flux, i.e., the energy radiated from the wafers, exhibits a divergence at the margin of the wafer. Regarding the distribution of temperature this has the result that the marginal area of the wafer is colder in a steady state.

3. Effect of structures

Thin optical films, which are geometrically structured and provided on the surface of the wafer, may effect a constructive or destructive interference in a part of the radiant energy and may thus give rise to structure-determined inhomogeneities of temperature.

A geometric or chemical structuring of the various opaque coatings on the wafer may also give rise to inhomogeneities of temperature if their electron configurations differ greatly so that they have different absorbances.

Attempts to solve the problems encountered are reflected by patents relating to the design of the chamber and of the reflectors and to the measurement of temperature in such systems. Such patents include U.S. Pat. No. 4,680,447 (Glenn Incorp.), U.S. Pat. No. 4,581,520 (M. Haond), U.S. Pat. No. 4,550,245 (Ushio Denki), U.S. Pat. No. 4,436,985 (GCA Corp.); U.S. Pat. No. 4,356,384 (A.G. Associates), U.S. Pat. No. 4,101,759

(General Electric Co.), U.S. Pat. No. 3,862,397 (Applied Materials), EP 0,290,692 A1 (A.G. Associates), and U.S. Pat. No. 4,836,138 (Epsilon Technology).

Whereas the above-mentioned patents describe various designs and arrangements of the means for a radiant heating of various semiconductor materials, none of the above-mentioned patents is concerned with the problems relating to the timing of the lamp signals and to their adaptation to various substrate materials and processes.

Optical measuring methods for use in RTP systems have been described in the following patents: U.S. Pat. No. 4,979,134 (Minolta), Japanese Patent 60-253939 (A) (Fujitsu) and Japanese Patent 60-131430 (A) (Dainihon Screens). In accordance therewith it has been endeavored to ensure a more rapid heating of various substrates and/or to provide systems in which the lamps exhibit a faster response.

It has been assumed that the thermal inhomogeneities in the substrate material will level rather soon to such a degree that the residual differences are no longer dangerous to the various structures. A fact which is neglected in that assumption resides in that processes related to the absorption of the photons proceed in exact coincidence with the change of the lamp signal and that vertical and particularly lateral temperature differences in the substrate will take up to milliseconds (vertical) or up to several seconds (lateral) owing to the conduction of heat (particularly the diffusion of phonons) so that they may last much longer than the response times of the lamps.

As a result, thin structured layers on the surface of the substrate will be very highly stressed to different degrees for a short time in response to substantial changes of the lamp power.

All hardware-determined effects and particularly the photon box effect will increase such changes because the inhomogeneities of the effective primary energy flux and its fluctuations will be superposed on the effect of structure in coincidence.

SUMMARY OF THE INVENTION

For this reason it is an object of the invention to provide for a rapid thermal processing of delicate components, particularly of components made by and or used in the semiconductor industry, a method and an apparatus by which the occurrence of defects caused by inhomogeneities of temperature can be reduced.

In accordance with the invention this is accomplished in the method in that the maximum heating power delivered by the heat source or heat sources in an interval of time is adjusted to different values in accordance with a program for consecutive intervals of time, which may substantially be as short as desired, and independently of the parameters used to automatically control the heating power, and sudden changes of the heating power are avoided.

The object is also accomplished in that the density of the energy emitted by the heating source or heat sources in consecutive intervals of time, which may substantially be as short as desired, is adjusted in accordance with a program to such limited values or different predeterminable values in the reaction chamber that the difference between the density of the energy emitted by the heat source or heat sources and the density of the energy emitted by the components is continuously held approximately at the minimum which is achievable, with small variations, throughout the thermal processing, and the heating power-time curve has predetermined ramp slopes.

In the apparatus the object is accomplished in that the maximum heating power which is delivered by the heat source or heat sources in an interval of time is adapted to be adjusted to different values in accordance with a program for consecutive intervals of time, which may substantially be as short as desired, and is adapted to be limited independently of the parameters used to automatically control the heating power, and sudden changes of the heating power are avoided.

According to another preferred aspect the object is accomplished in that the density of the energy which is emitted by the heat source or heat sources in consecutive intervals of time, which may be substantially as short as desired, is adapted to be adjusted in accordance with a program to such automatically controlled limiting values or to such different predeterminable values that in the reaction chamber the difference between the density of the energy emitted by the heat source or heat sources and the density of the energy emitted by the components is continuously held approximately at the minimum which is achievable, with small variations, throughout the thermal processing, and the heating power-time curve has predetermined ramp slopes.

It has also been possible to generate lamp signals so that the inhomogeneities of temperature have been decreased for given ramp slopes. This will also permit a slipfree processing with a strongly reduced formation of defects.

But it is important to adapt the response time of the heat source and the monitoring of temperature in the system to the response time of the wafers.

In conjunction with a pyrometer having a response time of 50 ms, tungsten-halogen lamps are a good choice for the processing of conventional semiconductor wafers.

The apparatus in accordance with the invention is suitably so designed that measured values of the substrate temperature and the control values for the control of the heating power can be stored at the same time for an optimizing of the processing of various substrates. Power peaks of the heat sources can be limited independently of the control parameters and in such a manner that sudden power changes will be avoided within different programmable limits in consecutive intervals of time, which may be as short as desired.

That limitation is not concerned with the rate of rise of the heating power—that rate of rise can be limited only by a change of the control parameters—but is concerned with a limitation of the maximum manipulated input and a parallel adaptation of the control range to the limited range of the manipulated input in such a manner that the correcting rate will not be reduced.

That method will result in a gentle heating up so that particularly with materials having thin layers the occurrence of temperature-induced lateral and vertical stresses will strongly be reduced whereas there will be substantially no delay and the precision of the control will not be reduced.

In a defect-guarded RTP method, the primary energy density of the heating system is adjusted in accordance with a program in consecutive intervals of time, which may be as short as desired, to such limited values or to such different fixed values, which are predeterminable, that in the reaction chamber the difference between the density of the primary and secondary energies is continuously held at the minimum which can be achieved, with small variations, throughout the thermal processing whereas the temperature-time curve has predetermined ramp slopes.

The primary energy density is the energy density of the energy flux which passes from the heat source or heat sources to the component. The secondary energy density is the energy flux which is emitted by the component.

During a variable interval of time that difference between the primary and secondary energy densities may be required to comply with a monotonous function of time.

With that design of the apparatus, the method can be carried out only in dependence on the stored setpoints for the heating power independently of the pyrometer reading when an optimum heating power program has been established.

DETAILED DESCRIPTION OF THE PREFERRED EMBODIMENTS

Figure 1:
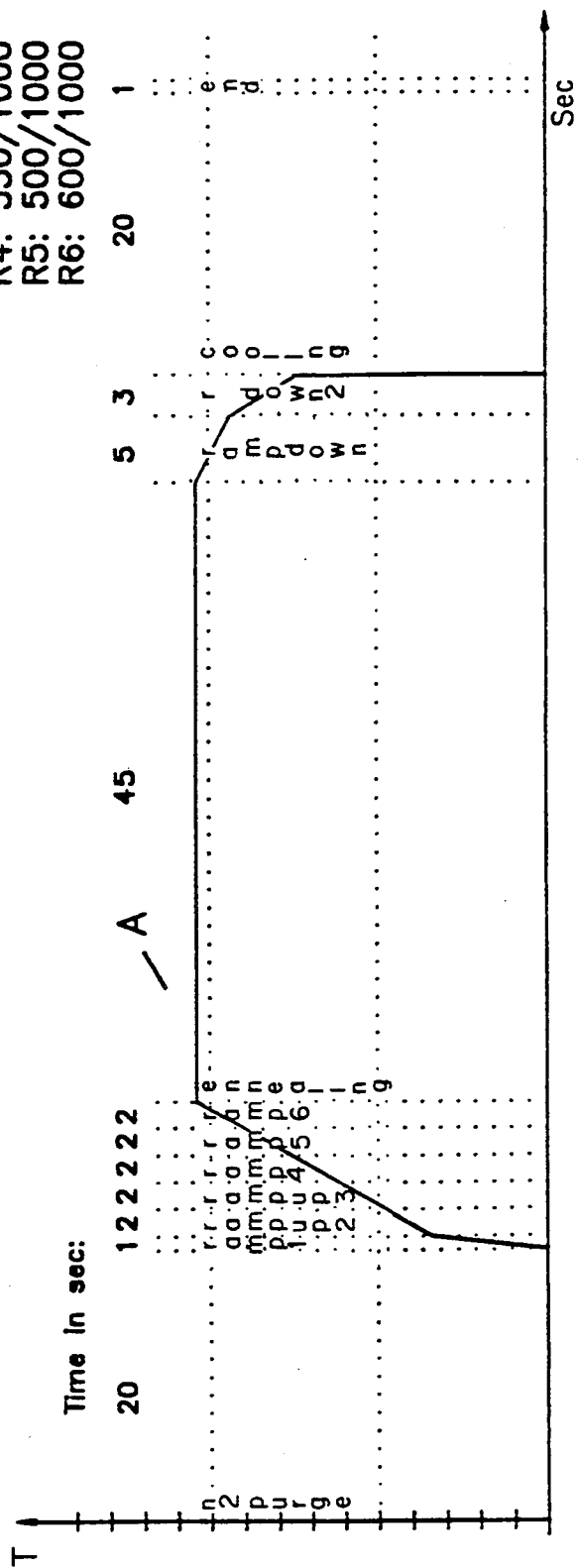
FIG. 1 shows the temperature-time curve for a rapid heating in a defect-guarded method in accordance with the invention.

The invention will be now be described more in detail with reference to the drawing.

In the defect-guarded method for a thermal processing of delicate components, the temperature of the components is changed in a reaction chamber by means of at least one heat source, which is automatically controlled by at least one heating power controller in dependence on control parameters. The maximum heating power which is delivered by the heat source or heat sources in an interval of time is adjusted to different values in accordance with a program in consecutive intervals of time, which may be substantially as short as desired, inasmuch as such variations are required for the heating method, and said power is limited independently of the parameters used to automatically control the heating power. Sudden changes of the heating power are avoided.

Alternatively, the density of the energy which is emitted by the heat source or heat sources in consecutive intervals of time, which may be substantially as short as desired, is adjusted in accordance with a program to such limited values or to such different predeterminable values that in the reaction chamber the difference between the density of the energy emitted by the heat source or heat sources and the density of the energy emitted by the components is continuously held at the minimum which can be achieved, with small variations, throughout the thermal processing, and the heating power-time curve has predetermined ramp slopes.

The requirements to be met by a defect-guarded RTP method can well be complied with if the temperature-time program and lamp power-time program can be predetermined step for step either linearly or in accordance with certain mathematical functions. The functions may be, e.g., sin (t), sin$^2$ (t), $e^t$, $t^2$, $\sqrt{t}$ or others, wherein t is time. Such a processing will be particularly interesting for semiconductor wafers having a low dopant content so that the emissivity in the range from room temperature to 600° to 800° C. will highly (and non-linearly) depend on temperature.

In the reaction chamber the component is irradiated from one or more sides and the radiation is substantially completely reflected by the reflecting wall surfaces of the reaction chamber.

The density of the energy which is incident on the component from above and from below is adapted to be separately limited in different method steps in ratios which can substantially be selected as desired and is separately monitored and controlled.

The heating power of the lamps in the heat source or heat sources is automatically controlled for each lamp in order to improve the horizontal homogeneity of temperature. The change of the heating power of the lamps with time and/or the change of the substrate temperature with time can be stored for all method steps, and any desired lamp power-time values can be used in a suitable sequence of time in subsequent runs of the method as a defined heating power program for monitoring the lamps.

Because the rise of the heating power with time can be effected in any desired steps, it is possible to include in the program additional method steps, in which the heating power is constant so that the lateral and vertical inhomogeneities of temperature within the component can level at any desired time.

According to a further feature of the invention the component in the reaction chamber is concentrically surrounded by a ring or frame, which is made of a material that is similar to the material of the component and which has approximately the same thickness as the component so that local inhomogeneities of temperature in the component, particularly in marginal areas, will be reduced.

Alternatively or additionally it is possible to vary the heating of the marginal area of the component, particularly in case of different substrate materials, by means of diaphragms, adjustable reflectors or additional lamps, which can separately be controlled and/or automatically controlled.

For the processing of conventional semiconductor wafers, the lamps of the heat sources may consist of tungsten-halogen lamps and may be used in combination with a pyrometer having a response time of about 50 ms.

The optical monitoring of temperature in the system may be calibrated even under process conditions. The calibration will be performed automatically and with a high resolution (at least 0.5° C.) throughout the desired temperature range.

Any desired time-dependent courses of rising ("ramp up") and falling ("ramp down") slopes can be programmed for the temperature control and desirably for the control of the purging with gas in the reaction chamber.

Two illustrative embodiments of the apparatus in accordance with the invention will be described hereinafter.

In the first illustrative embodiment, an apparatus for the defect-guarded thermal processing of delicate components comprises at least one heat source, which is arranged in a reaction chamber and is automatically controlled by a heating power controller in dependence on control parameters and used to change the temperature of the components. The power of the heat source or heat sources can be adjusted in accordance with a program to different values in consecutive intervals of time, which may be as short as desired, and independently of the parameters for the automatic heating power control. The measured values of the substrate temperature and the values of the manipulated inputs for the control of the heating power can be stored at the same time, and any desired lamp power-time functions can be used for subsequent runs as a defined heating power program for monitoring the heating power independently of the pyrometer signal.

Alternatively, in the second illustrative embodiment, the density of the energy emitted by the heat source or heat sources in consecutive intervals of time, which may substantially be as short as desired, may be adjusted in accordance with a program to limited values or to different predetermined values in such a manner that in the reaction chamber the difference between the density of the energy emitted by the heat source or heat sources and the density of the energy emitted by the component is continuously held at the minimum which can be achieved, with small variations, throughout the thermal processing and the heating power-time curve has predetermined ramp slopes.

The heat source or heat sources and their lamps are so arranged in the reaction chamber that the component can be irradiated from more than one side and the wall surfaces of the reaction chamber are designed to substantially completely reflect the heating radiation.

The density of the energy acting on the component from above and from below in different method steps is adapted to be separately limited in any desired selectable ratios by the heating power controller and to be separately monitored and controlled.

To improve the horizontal homogeneity of temperature the heating powers of the lamps of a heat source can individually be controlled by the heating power controller.

The lamp power-time curve of the lamps and/or the substrate temperature-time curve for all method steps is adapted to be stored in the apparatus and any desired lamp power-time values can subsequently be used in a suitable sequence of time as a defined heating program for the monitoring and/or control of the lamps.

If the rise of the heating power with time is effected in any desired steps the program may also comprise method steps in which the substrate temperature is constant so that the lateral and vertical inhomogeneities of temperature within the component can level at any desired time.

According to a further feature of the invention the reaction chamber of the apparatus contains a concentrically arranged ring or frame, which is made of a material that is similar to the material of the component and has about the same thickness as the component so that local inhomogeneities of temperature in the component, particularly in marginal areas, will be reduced.

The irradiation chamber also contains diaphragms, adjustable reflectors or dedicated lamps, which are adapted to be separately controlled and/or automatically controlled and serve for a stronger or less strong local heating of the marginal area of the component, particularly in case of various substrate materials.

FIG. 1 shows a temperature-time curve A for use in the method in accordance with the invention. In the method, the temperature is raised to 1050° C. during the first 11 seconds, whereafter a soaking is effected for 45 seconds and the temperature is then lowered in two steps within the next 8 seconds. The ratios of the several consecutive power steps are as follows:

R1 150:1000
R2 200:1000
R3 250:1000
R4 350:1000
R5 500:1000
R6 600:1000

Figure 2:
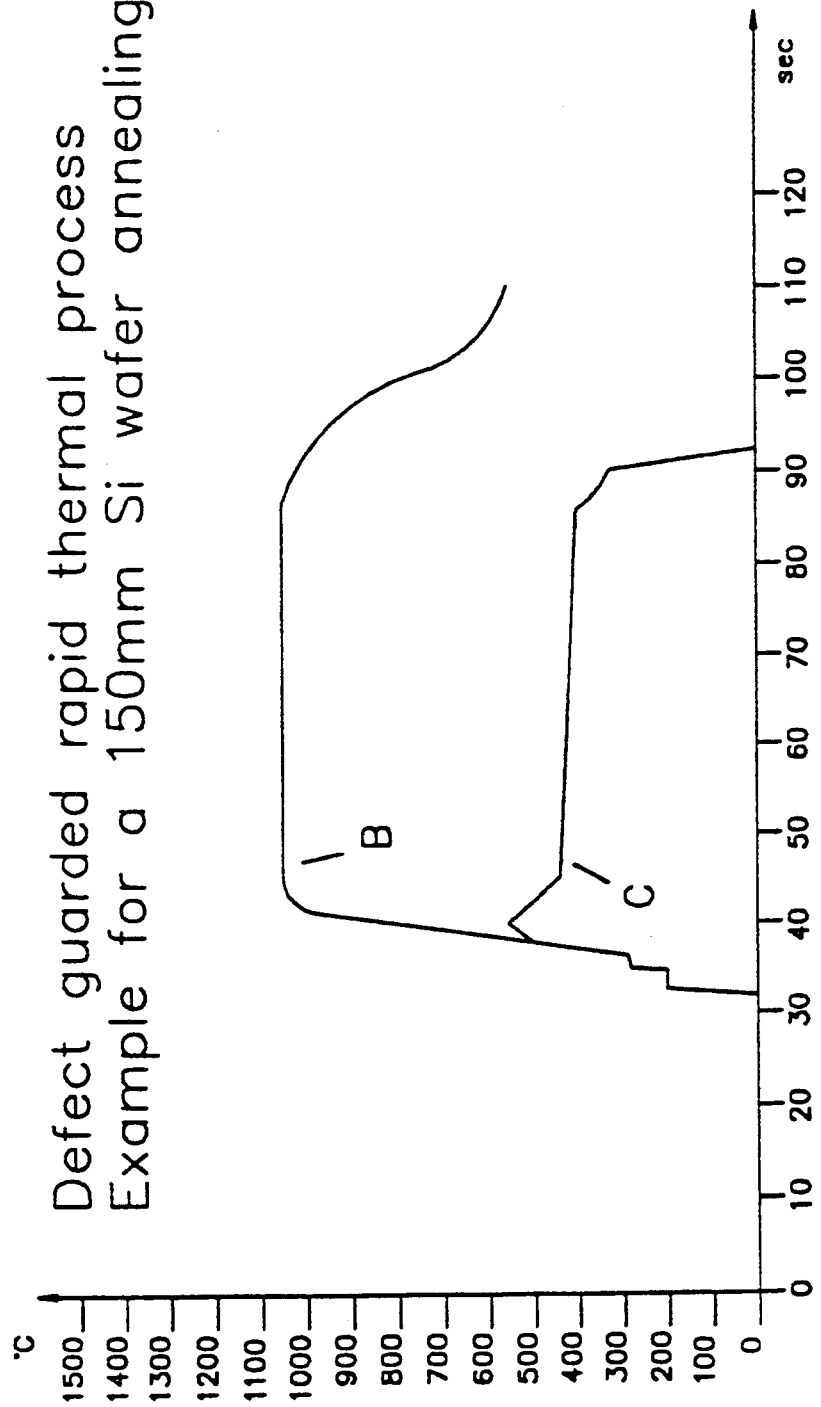
FIG. 2 shows the stepwise changes of the limited heating power in dependence on time and the changes of the pyrometer readings with time.

FIG. 2 shows a curve B, which indicates stored actual temperatures in dependence on time, and a curve C, in which the limited heating power values are plotted against time. The sample used consisted of a silicon wafer 150 mm in diameter.

Figure 3:
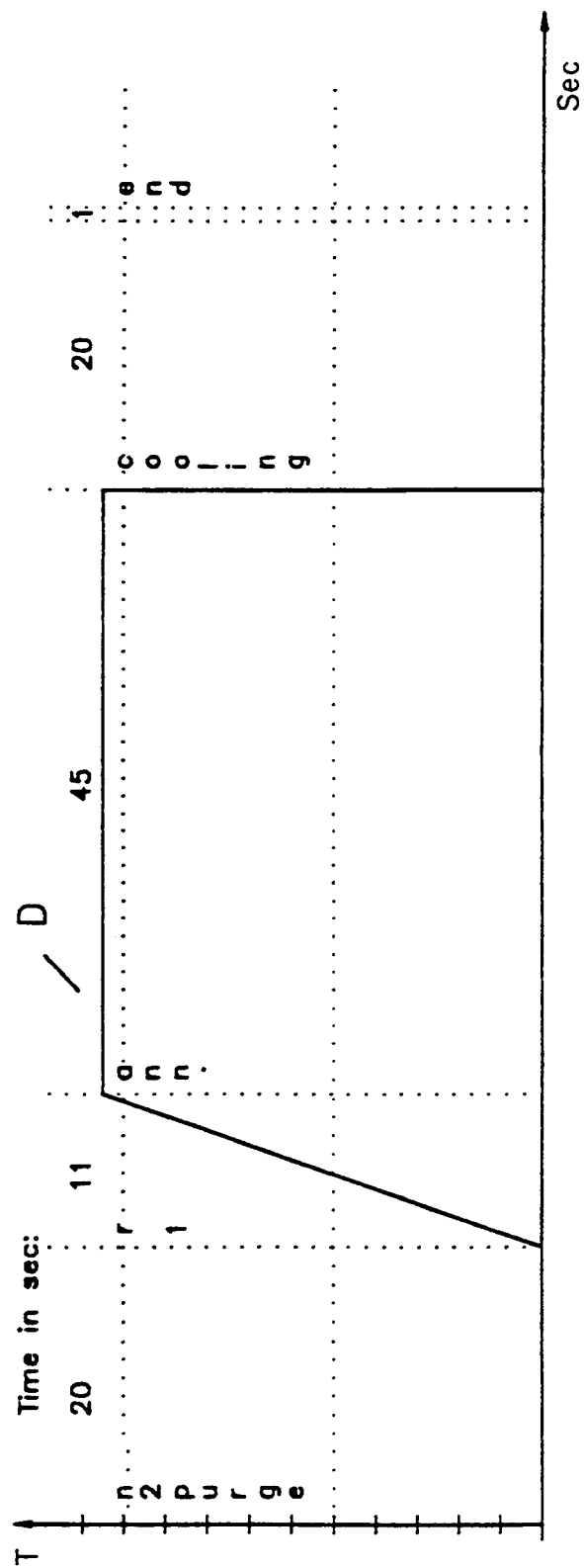
FIG. 3 illustrates a conventional rapid heating method using no power limits.

FIG. 3 represents a conventional rapid heating program without limited power values.

Figure 4:
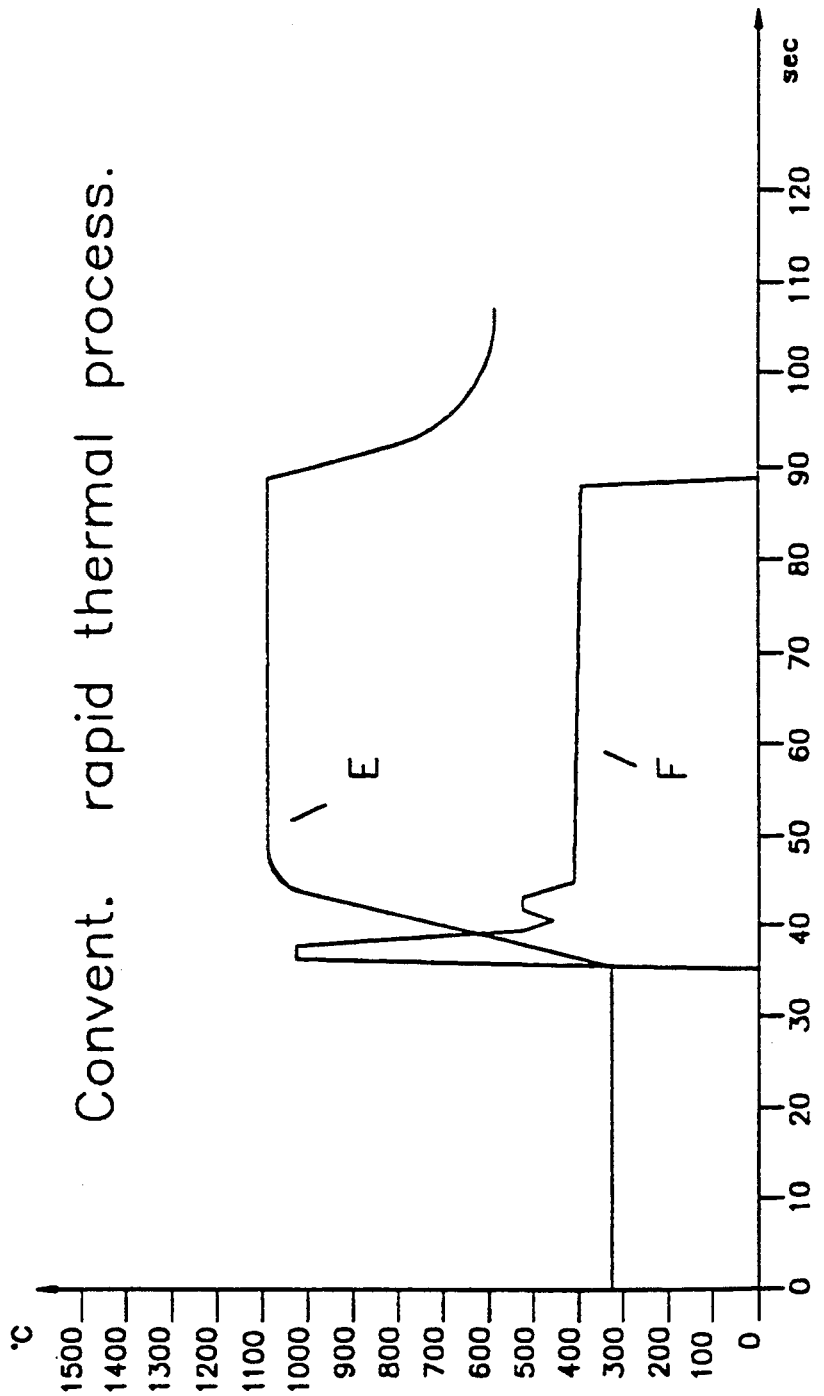
FIG. 4 shows the changes of the pyrometer readings in dependence on time in a conventional rapid heating method and the changes of the lamp power in dependence on time.

FIG. 4 shows the temperature-time curve associated with FIG. 3 and the lamp power-time curve for the time of the temperature rise of the silicon wafer.

Figure 5:
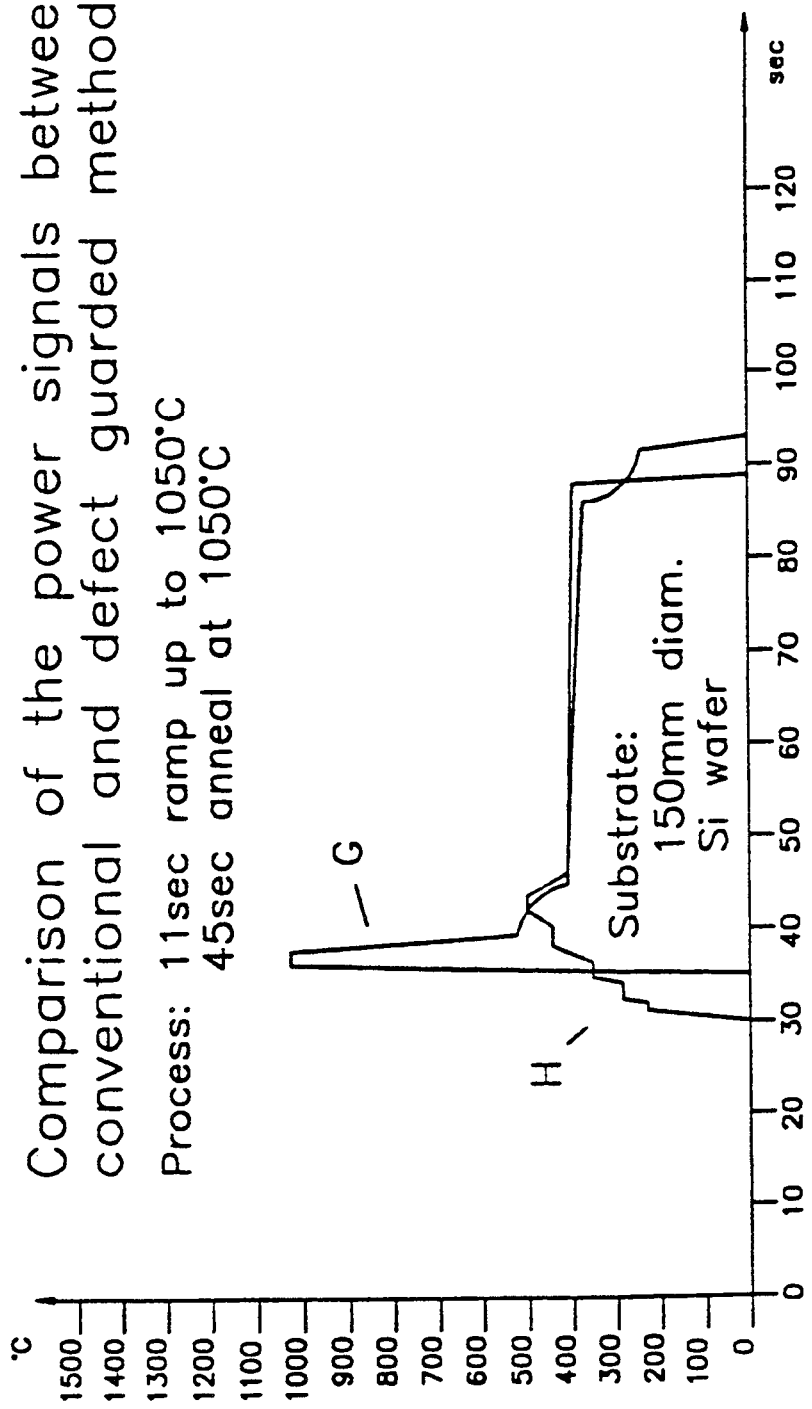
FIG. 5 illustrates a comparison of the time-dependent power signals in the conventional method and in the defect-guarded method.

FIG. 5 represents the power signals of the conventional method and of the defect-guarded method in accordance with the invention. In either case, a silicon wafer 150 mm in diameter was heated to 1060° C. in 11 seconds and was then soaked through 45 seconds. Curve G indicates the peak of the heating power of the lamp during the heating-up mode. Curve H indicates the stepwise increase of the heating power.

Figure 6:
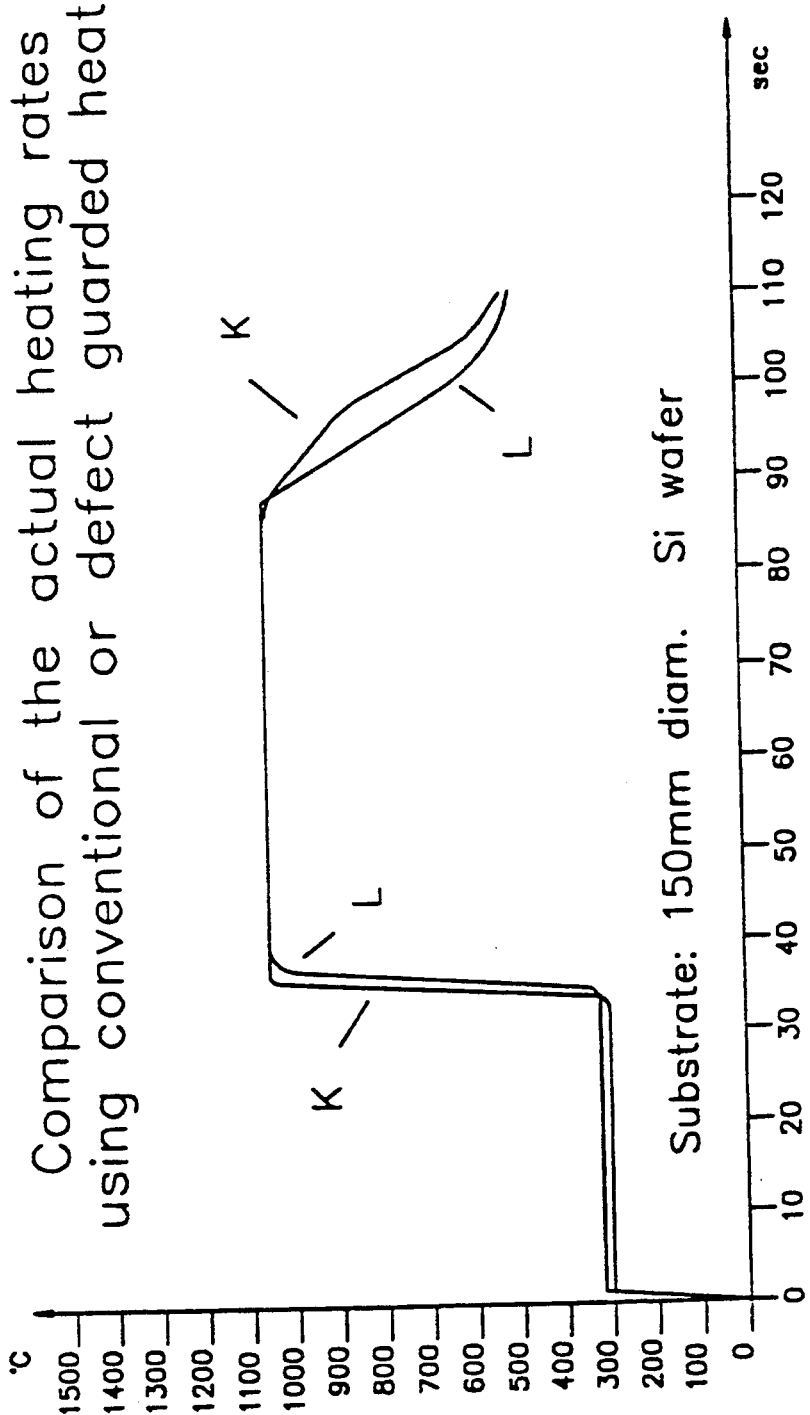
FIG. 6 illustrates a comparison of the heating-up rates in the conventional method and in the defect-guarded method.

In FIG. 6 the actual rates of temperature rise are plotted against time for the conventional method and for the defect-guarded method in accordance with the invention. In curve K the rates achieved in the method in accordance with the invention and in curve L the rates achieved in the conventional method are plotted against time.

It is clearly apparent that the deviations are very small during the temperature rise and that in the method in accordance with the invention the temperature descent is programmed to be effected in two steps so that the defect rate will be further reduced. That measurement was also effected with a silicon substrate that was 150 mm in diameter.

Figure 7:
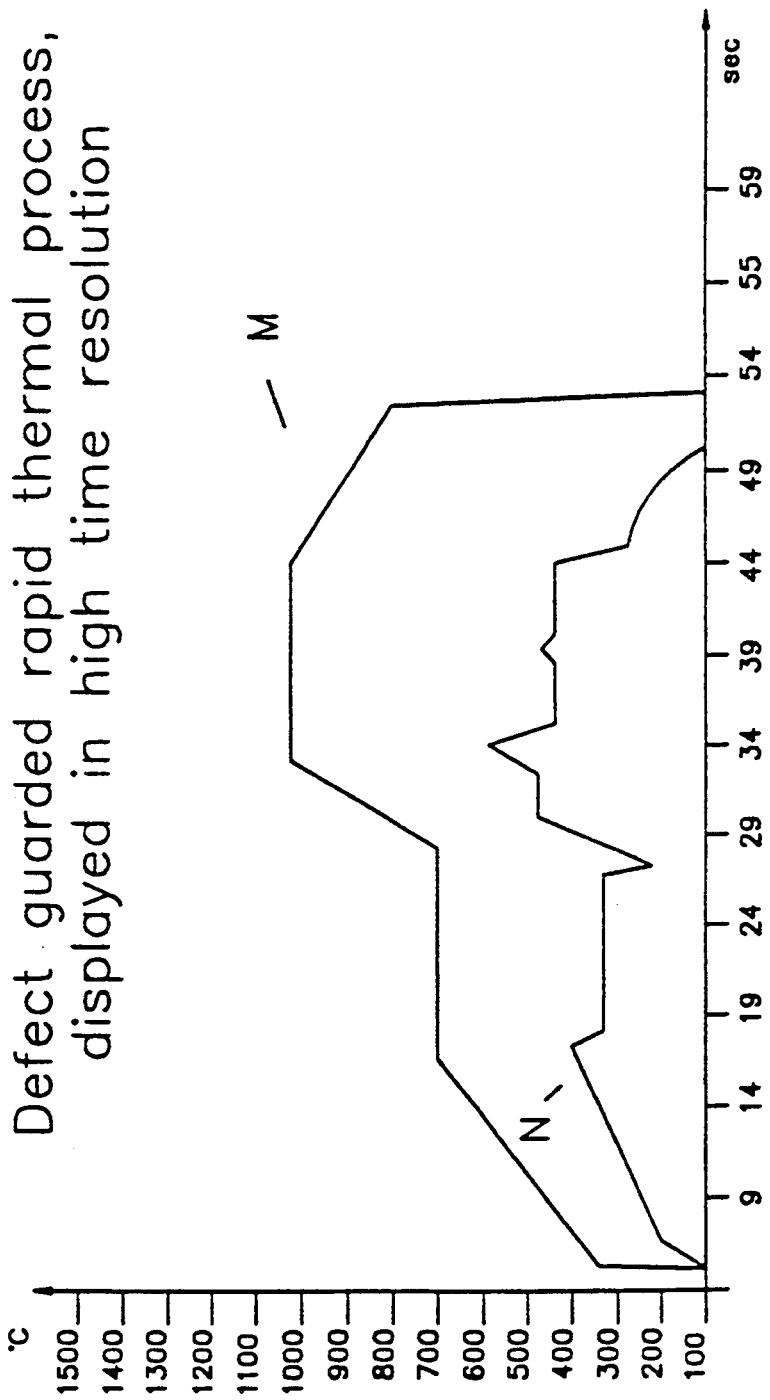
FIG. 7 illustrates with a high resolution the stored temperature course in a rapid heating method.
Figure 8:
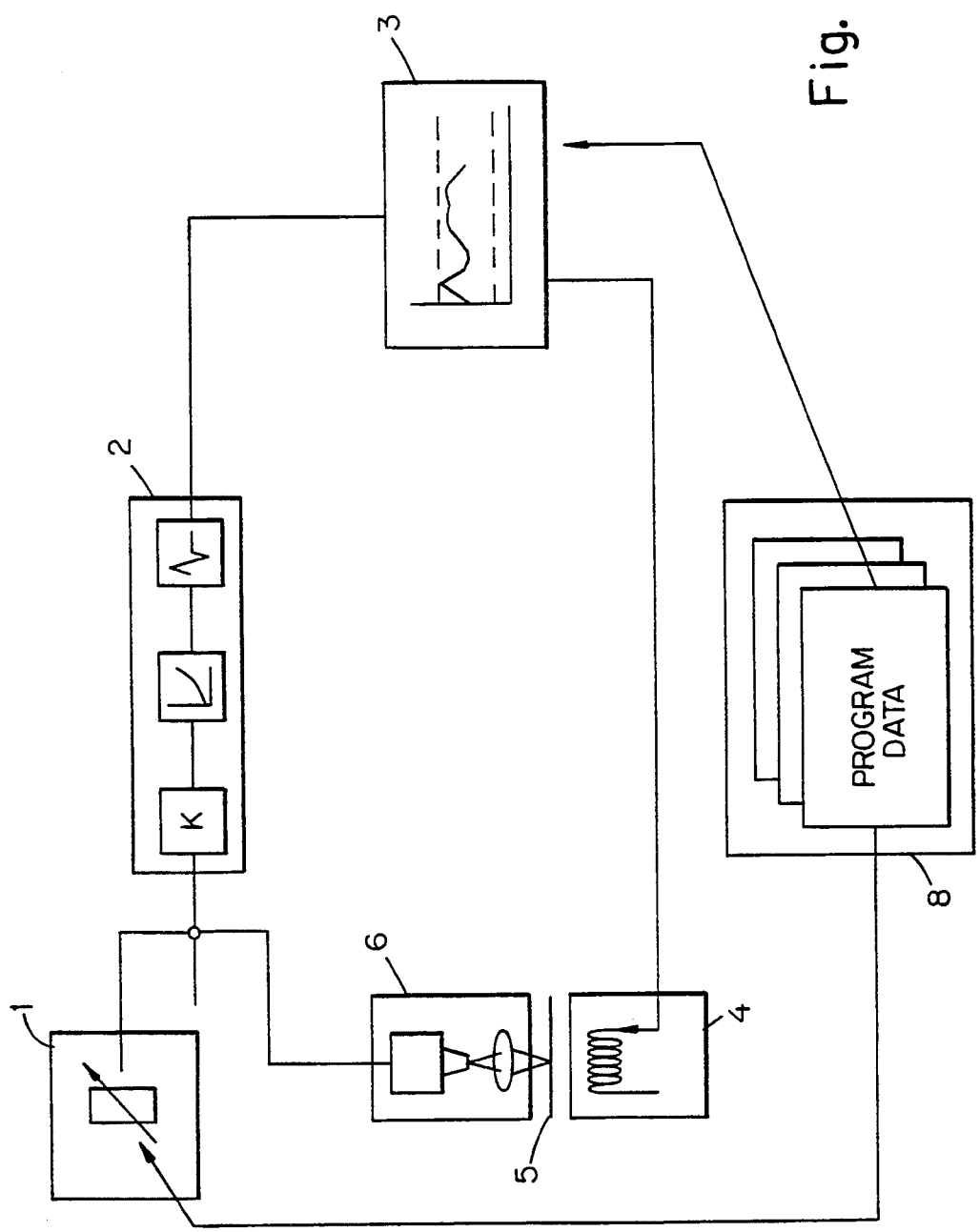
FIG. 8 is a sketch showing an apparatus for carrying out the invention.

FIG. 7 represents the rapid heating method carried out with a high resolution of time. In curve M the pyrometer readings are plotted against time. In curve N the limited lamp powers increased in steps are plotted against time.

The invention permits a defect-guarded rapid thermal processing of delicate components. As a result of the invention, the occurrence of defects caused in a rapid thermal processing by inhomogeneities of temperature can be reduced. In the corresponding system a defect-guarded RTP method is carried out in such a manner that the energy density of the heating means in consecutive intervals of time, which may be as short as desired, is adjusted by an automatic control of such limiting values or to such fixed values that in the reaction chamber the difference between the primary and secondary energy densities is almost continuously held at the minimum which can be achieved throughout the thermal processing and the ramps have predetermined slopes.

We claim:

1. A method for a rapid thermal processing of delicate components of the semiconductor industry, wherein the delicate components are in a heating chamber and the temperature thereof is changed by at least one heating source arranged within the heating chamber, the at least one heating source controlled by a heating control circuit, comprising the steps of:

controlling each heating source to produce a different programmed maximal heating power in consecutive intervals of time shorter than an arbitrary maximum, changing the heating power of adjacent intervals of time by avoiding sudden changes of the heating power, and limiting the heating power of the adjacent intervals independently of a control input and control parameters of the heating control circuit.

2. A method according to claim 1, comprising the step of irradiating the component in the heating chamber from more than one side and substantially completely reflecting the radiation by the walls of the heating chamber.

3. A method according to claim 1, comprising the further steps of storing a level of heating power of lamps of the heating source with time and storing a substrate temperature with time for predetermined method steps, and using stored lamp power-time values to monitor the lamps in a sequence of time in subsequent runs of the method as a defined heating power program.

4. A method according to claim 1, comprising the steps of effecting a rise of heating power with time in steps, further including in the program steps in which the heating power is constant so that lateral and vertical inhomogeneities of temperature within the component can stabilize at a predetermined time.

5. A method for a rapid thermal processing of delicate components of the semiconductor industry, wherein the delicate components are in a heating chamber and the temperature thereof is changed by at least one heating source, comprising the steps of:

detecting a difference between a density of energy emitted by each heating source and a density of energy emitted by the delicate components, continuously holding a difference between the density of energy emitted by each heat source and the density of energy emitted by said delicate components substantially at a minimum with small variations throughout the thermal processing by adjusting the density of energy emitted by each heat source in consecutive intervals of time to different predetermined values, and providing a ramp of substantially constant slope as a control input time function of the temperature.

6. A method according to claim 5, comprising the step of irradiating the component in the heating chamber from more than one side and substantially completely reflecting the radiation by the walls of the heating chamber.

7. A method according to claim 5, comprising the further steps of storing a level of heating power of lamps of the heating source with time and storing a substrate temperature with time for predetermined method steps, and using stored lamp power-time values to monitor the lamps in a sequence of time in subsequent runs of the method as a defined heating power program.

8. A method according to claim 5, comprising the steps of effecting a rise of heating power with time in steps, further including in the program steps in which the heating power is constant so that lateral and vertical inhomogeneities of temperature within the component can stabilize at a predetermined time.

9. A method according to claim 1, comprising the further step of additionally temperature controlling a marginal area of the component by means of diaphragms, adjustable reflectors or dedicated lamps, which are separately controlled.

10. A method according to claim 5, comprising the further step of additionally heating a marginal area of the component by means of diaphragms, adjustable reflectors or dedicated lamps, which are separately controlled.

11. A method for a rapid thermal processing of delicate components of the semiconductor industry, wherein the delicate components are in a heating chamber and the temperature thereof is changed by at least one heating source, wherein the heating chamber is surrounded by reflectors and said at least one heating source is arranged within said heating chamber, comprising the steps of:

controlling each heating source to produce a different programmed maximal heating power in consecutive intervals of time shorter than an arbitrary maximum, changing the heating power of adjacent intervals of time by avoiding sudden changes of the heating power, and limiting the heating power of the adjacent intervals independently of a control input and control parameters of the heating control circuit.

12. A method for a rapid thermal processing of delicate components of the semiconductor industry, wherein the delicate components are in a heating chamber and the temperature thereof is changed by at least one heating source, wherein the heating chamber is surrounded by reflectors, comprising the steps of:

detecting a difference between a density of energy emitted by each heating source and a density of energy emitted by the delicate components, continuously holding a difference between the density of energy emitted by each heat source and the density of energy emitted by said delicate components substantially at a minimum with small variations throughout the thermal processing by adjusting the density of energy emitted by each heat source in consecutive intervals of time to different predetermined values, and providing a ramp of substantially constant slope as a control input time function of the temperature.

13. A method for a rapid thermal processing of delicate components of the semiconductor industry, comprising the steps of:

heating in a heating chamber by at least one heat source, adjusting the maximum heating power delivered by the at least one heat source in an interval of time to different values in accordance with a program for consecutive intervals of time having predetermined durations, and independently of the parameters used to automatically control the heating power, and avoiding sudden changes of the increasing heating power, irradiating the component in the heating chamber from more than one side and reflecting the radiation by the walls of the heating chamber, and separately limiting a density of energy which is incident on the component from above and from below in different method steps in selectable ratios, wherein the incident energy is separately monitored and controlled.

14. A method for a rapid thermal processing of delicate components of the semiconductor industry, comprising the steps of:

heating in a heating chamber by at least one heat source to change the temperature of the components, continuously holding a difference between a density of energy emitted by each heat source and a density of energy emitted by the components in the heating chamber a minimum which is achievable, with small variations, throughout the thermal processing, by adjusting the density of energy emitted by at least one heat source in consecutive intervals of time, to limited values or different predeterminable values in accordance with a program wherein a heating power-time curve has predetermined ramp slopes, irradiating the component in the heating chamber from more than one side and substantially completely reflecting the radiation by the walls of the heating chamber, separately limiting the density of the energy which is incident on the component from above and from below in different method steps in selectable ratio, wherein the incident energy is separately monitored and controlled.

15. A method according to claim 14, comprising the further step of individually controlling the heating power of lamps of the at least one heat source to improve a horizontal homogeneity of temperature.

16. A method according to claim 13, comprising the further step of individually controlling the heating power of the lamps of the at least one heat source to improve the horizontal homogeneity of temperature.

17. An apparatus for a rapid thermal processing of delicate components of the semiconductor industry, comprising at least one heat source, which is disposed in a heating chamber and is automatically controlled by a heating power controller and used to change the temperature of the components, program means for adjusting a maximum heating power which is delivered by at least one heat source in an interval of time to different values in accordance with a program for consecutive intervals of time having predetermined durations, said program means operating to limit the maximum heating power independently of parameters used to automatically control the heating power, and to avoid sudden changes of the increasing heating power.

18. An apparatus according to claim 17, wherein each heat source and lamp therein is arranged in the heating chamber for irradiating the component from more than one side and wherein the wall surfaces of the heating chamber are designed to substantially completely reflect the heating radiation.

19. An apparatus according to claim 17, wherein said at least one heat source includes lamps connected to be individually controlled or automatically controlled by the heating power controller in order to improve a horizontal homogeneity of temperature.

20. An apparatus according to claim 17, further comprising means for storing a lamp power-time curve of lamps of said heat source and/or a substrate temperature time curve, and means for using said lamp power-time values in a predetermined time sequence as a defined heating program for monitoring and/or control of the lamps.

21. An apparatus according to claim 17, further comprising means for stepwise raising a lamp power of lamps of said heat source in dependence on time in predetermined steps and for programming a constant substrate temperature for stabilizing lateral and vertical inhomogeneities of temperature within the component in a predetermined time.

22. An apparatus according to claim 17, wherein the heating chamber contains at least one of separately controlled diaphragms, adjustable reflectors, and dedicated lamps, for varying local heating of a marginal area of the component.

23. An apparatus for a rapid thermal processing of delicate components of the semiconductor industry, comprising at least one heat source, which is disposed in a heating chamber and is automatically controlled by a heating power controller and used to change the temperature of the components, program means for continuously holding a difference between a density of energy emitted by at least one heat source and a density of energy emitted by the components in the heating chamber substantially at the minimum which is achievable, with small variations, by adjusting the density of energy emitted by at least one heat source in consecutive intervals of time having predetermined durations to different predetermined values, and providing a heating power-time curve which, throughout the thermal processing, has predetermined ramp slopes.

24. An apparatus according to claim 23, wherein each heat source and lamp therein is arranged in the heating chamber for irradiating the component from more than one side and wherein the wall surfaces of the heating chamber are designed to substantially completely reflect the heating radiation.

25. An apparatus according to claim 23, wherein said at least one heat source includes lamps connected to be individually controlled or automatically controlled by the heating power controller in order to improve a horizontal homogeneity of temperature.

26. An apparatus according to claim 23, further comprising means for storing a lamp power-time curve of lamps of said heat source and/or a substrate temperature time curve, and means for using said lamp power-time values in a predetermined time sequence as a defined heating program for monitoring and/or control of the lamps.

27. An apparatus according to claim 23, further comprising means for stepwise raising a lamp power of lamps of said heat source in dependence on time in predetermined steps and for programming a constant substrate temperature for stabilizing lateral and vertical inhomogeneities of temperature within the component in a predetermined time.

28. An apparatus according to claim 23, wherein the heating chamber contains at least one of separately controlled diaphragms, adjustable reflectors, and dedicated lamps, for varying local heating of a marginal area of components having different substrate materials.

29. An apparatus for a rapid thermal processing of delicate components of the semiconductor industry, comprising at least one heat source disposed in a heating chamber and automatically controlled by a heating power controller and to change a temperature of the components, program controlled means for adjusting a maximum heating power which is delivered by at least one heat source in an interval of time to different values in accordance with a program for consecutive intervals of time having predetermined durations, and for limiting the maximum heating power independently of parameters used to automatically control the heating power and to avoid sudden changes of increasing heating power, wherein each heat source and lamp therein is arranged in the heating chamber for irradiating the component from more than one side and wherein the wall surfaces of the heating chamber are designed to substantially completely reflect the heating radiation, and means for separately limiting a density of the energy acting on the component from above and from below in predetermined ratios and for separately monitoring and/or controlling the density.

30. An apparatus for a rapid thermal processing of delicate components of the semiconductor industry, comprising at least one heat source disposed in a heating chamber and automatically controlled by a heating power controller and to change a temperature of the components, program controlled means for continuously holding a difference between a density of energy emitted by said at least one heat source and a density of energy emitted by the components in the heating chamber substantially at the minimum which is achievable, with small variations, by adjusting the density of energy emitted by at least one heat source in consecutive intervals of time having predetermined durations, to different predetermined values, and providing a heating power-time curve which, throughout the thermal processing, has predetermined ramp slopes, wherein each heat source and lamp therein is arranged in the heating chamber for irradiating the component from more than one side and wherein the wall surfaces of the heating chamber are designed to substantially completely reflect the heating radiation, and means for separately limiting a density of the energy acting on the component from above and from below in predetermined ratios and for separately monitoring and/or controlling the density.

* * * * *